(12) United States Patent
Li (10) Patent No.: US 7,816,610 B2
(45) Date of Patent: Oct. 19, 2010

(54) LAYOUT CIRCUIT

(75) Inventor: Ching-Chih Li, Taipei County (TW)

(73) Assignee: Mediatek Inc., Hsin-Chu (TW)

( * ) Notice: Subject to any disclaimer, the term of this patent is extended or adjusted under 35 U.S.C. 154(b) by 135 days.

(21) Appl. No.: 11/853,061

(22) Filed: Sep. 11, 2007

(65) Prior Publication Data

US 2008/0257583 A1    Oct. 23, 2008

Related U.S. Application Data

(60) Provisional application No. 60/912,704, filed on Apr. 19, 2007.

(51) Int. Cl.
*H05K 1/03*    (2006.01)

(52) U.S. Cl. ...................... 174/255; 174/260

(58) Field of Classification Search .................. 174/255, 174/260, 261
See application file for complete search history.

(56) References Cited

U.S. PATENT DOCUMENTS

| | | | |
|---|---|---|---|
| 5,686,764 A | 11/1997 | Fulcher | |
| 5,784,262 A * | 7/1998 | Sherman | 361/777 |
| 6,198,635 B1 * | 3/2001 | Shenoy et al. | 361/760 |
| 6,452,115 B2 * | 9/2002 | Horiuchi et al. | 174/261 |
| 6,521,846 B1 | 2/2003 | Freda et al. | |
| 7,569,428 B2 * | 8/2009 | Isa et al. | 438/129 |

* cited by examiner

*Primary Examiner*—Ishwarbhai B Patel
(74) *Attorney, Agent, or Firm*—Thomas, Kayden, Horstemeyer & Risley (57) ABSTRACT

The layout circuit comprises a first 3×2 grid array and a second 3×2 grid array. The first 3×2 grid array comprises first, second and third signal contact points and the first and second fixed potential contact points are coupled to a first fixed potential. The first and second fixed potential contact points are arranged diagonally into the first 2×2 array and the first and second signal contact points are also arranged diagonally into the first 2×2 array. The second 3×2 grid array comprises fourth, fifth and sixth signal contact points and the third and fourth fixed potential contact points are coupled to the first fixed potential. The third and fourth fixed potential contact points are arranged diagonally into the second 2×2 array and the fourth and fifth signal contact points are also arranged diagonally into the second 2×2 array.

17 Claims, 6 Drawing Sheets

LAYOUT CIRCUIT

CROSS REFERENCE TO RELATED APPLICATIONS

This application claims the benefit of U.S. Provisional Application No. 60/912,704, filed on Apr. 19, 2007.

BACKGROUND OF THE INVENTION

1. Field of the Invention

The present invention relates to a layout circuit, and in particular relates to a layout circuit applied on substrates, chips and printed circuit boards.

2. Description of the Related Art

As integrated circuit devices become faster and more complex, the interconnections between one device with another device or with other components on a circuit board may limit the performance achievable for an integrated circuit system. Integrated circuit devices, such as chips, once had only a few interconnections. Now, hundreds of interconnections are required in more complex devices, along with more and more signals transmitting between these interconnections. Thus, more interconnections for chips are required.

Chip packaging is often subject to a number of tradeoffs, particular between performance and cost. Furthermore, the design of a chip package may also impact the performance and cost of the circuit board with which the chip package is used. In particular, system performance is often hindered by noise encountered in signals transmitted between a chip package and a circuit board.

Extra signal layers of a printed circuit board can provide more signal paths. But, extra signal layers may increase additional cost in the manufacturing of printed circuit boards and more defect occurrence during manufacturing. Thus, providing more signal paths without increasing signal layers is an important issue.

BRIEF SUMMARY OF THE INVENTION

A detailed description is given in the following embodiments with reference to the accompanying drawings.

An embodiment of a layout circuit is provided. The layout circuit comprises a first 3×2 grid array and a second 3×2 grid array. The first 3×2 grid array comprises first, second and third signal contact points and first and second fixed potential contact points coupled to a first fixed potential. The first and second fixed potential contact points are arranged diagonally into a first 2×2 array and the first and second signal contact points are arranged diagonally into the first 2×2 array. The second 3×2 grid array comprises fourth, fifth and sixth signal contact points and third and fourth fixed potential contact points coupled to the first fixed potential. The third and fourth fixed potential contact points are arranged diagonally into a second 2×2 array and the fourth and fifth signal contact points are arranged diagonally into the second 2×2 array.

Another embodiment of a layout circuit is provided. The layout circuit further comprises a third 3×2 grid array and a fourth 3×2 grid array. The third 3×2 grid array comprises seventh, eighth and ninth signal contact points and fifth and sixth fixed potential contact points coupled to a second fixed potential. The fourth 3×2 grid array comprises tenth, eleventh and twelfth signal contact points and seventh and eighth fixed potential contact points coupled to the second fixed potential. The fifth and sixth fixed potential contact points are arranged diagonally into a third 2×2 array and the seven and eighth signal contact points are arranged diagonally into the third 2×2 array. The seventh and eighth fixed potential contact points are arranged diagonally into a fourth 2×2 array and the tenth and eleventh signal contact points are arranged diagonally into the fourth 2×2 array.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
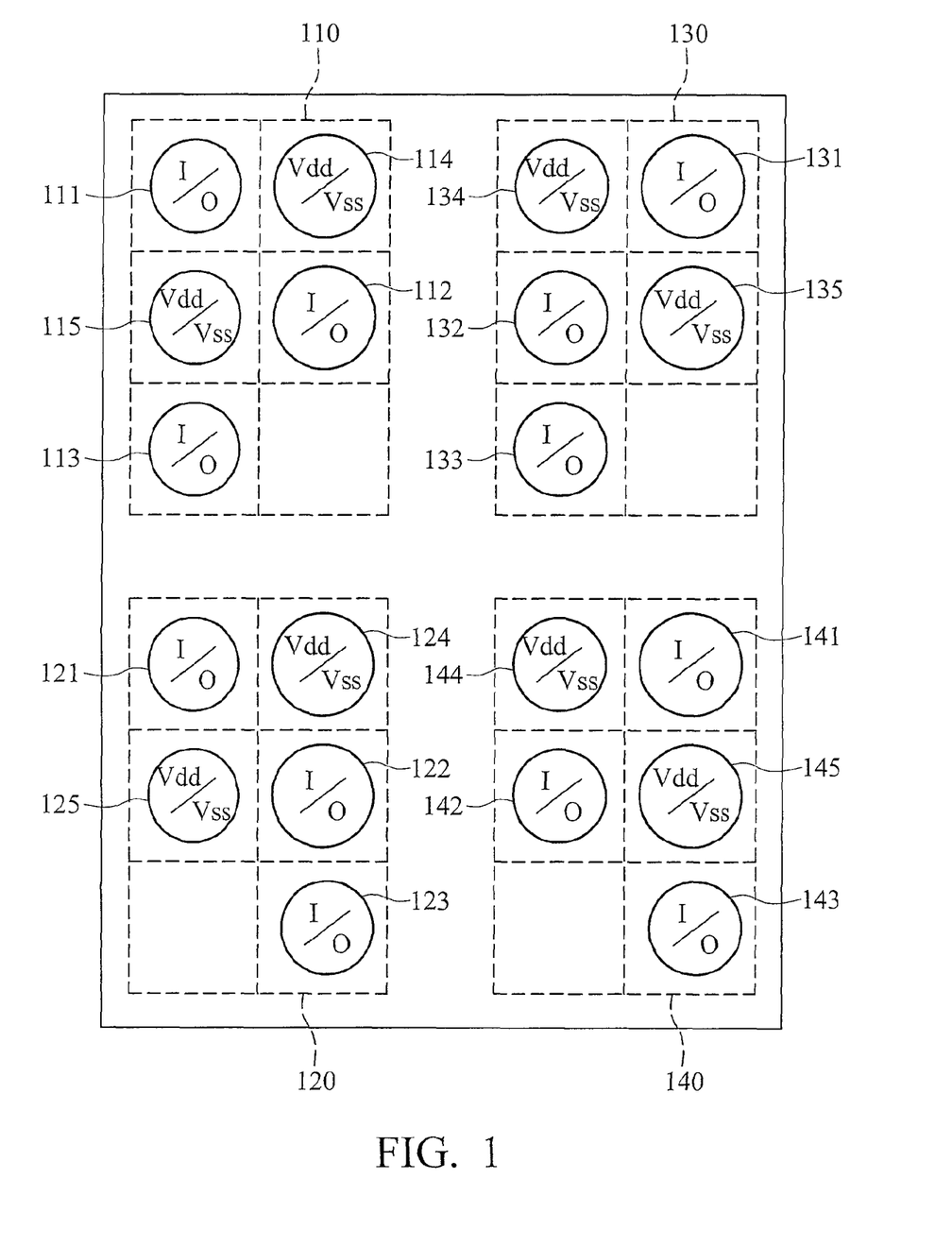
FIG. 1 is a layout pattern unit according to an embodiment of the invention.

FIG. 1 is a layout pattern unit according to an embodiment of the invention. The 3×2 grid array pattern 110 comprises signal contact points 111, 112 and 113 and fixed potential contact points 114 and 115. Signal contact points and fixed potential contact points can be substrate balls, substrate pins, printed circuit board pads or flip chip bumps. Signal contact points 111 and 112 are arranged diagonally into a 2×2 array and fixed potential contact points 114 and 115 are also arranged into the same 2×2 array. In addition, fixed potential contact points 114 and 115 are coupled to the same fixed potential, such as power Vdd and Vss or ground. The 3×2 grid array pattern 120 comprises signal contact points 121, 122 and 123 and fixed potential contact points 124 and 125. Signal contact points 121 and 122 are arranged diagonally into a 2×2 array and fixed potential contact points 124 and 125 are also arranged into the same 2×2 array. In addition, fixed potential contact points 124 and 125 are coupled to the same fixed potential, such as power Vdd and Vss or ground. The difference between 3×2 grid array patterns 110 and 120 is that signal contact points 113 and 123 are arranged in a different position. The 3×2 grid array pattern 130 comprises signal contact points 131, 132 and 133 and fixed potential contact points 134 and 135. The difference between 3×2 grid array patterns 110 and 130 is that fixed potential contact points are arranged diagonally into 2×2 arrays in a different way, as shown in FIG. 1. In 3×2 grid array pattern 130, fixed potential contact points 134 and 135 are coupled to the same fixed potential, such as power Vdd and Vss or ground. The 3×2 grid array pattern 140 comprises signal contact points 141, 142 and 143 and fixed potential contact points 144 and 145. The difference between 3×2 grid array patterns 120 and 140 is that the fixed potential contact points are arranged diagonally into 2×2 arrays in a different way. In 3×2 grid array pattern 140, fixed potential contact points 144 and 145 are coupled to the same fixed potential, such as power Vdd and Vss or ground. Each of 3×2 grid array patterns 110, 120, 130 and 140 can be rotated and disposed on flip chips, PCB substrates or BGA substrates. For example, 3×2 grid array pattern 110 can be rotated 180 degrees to be disposed on a flip chip.

Figure 2:
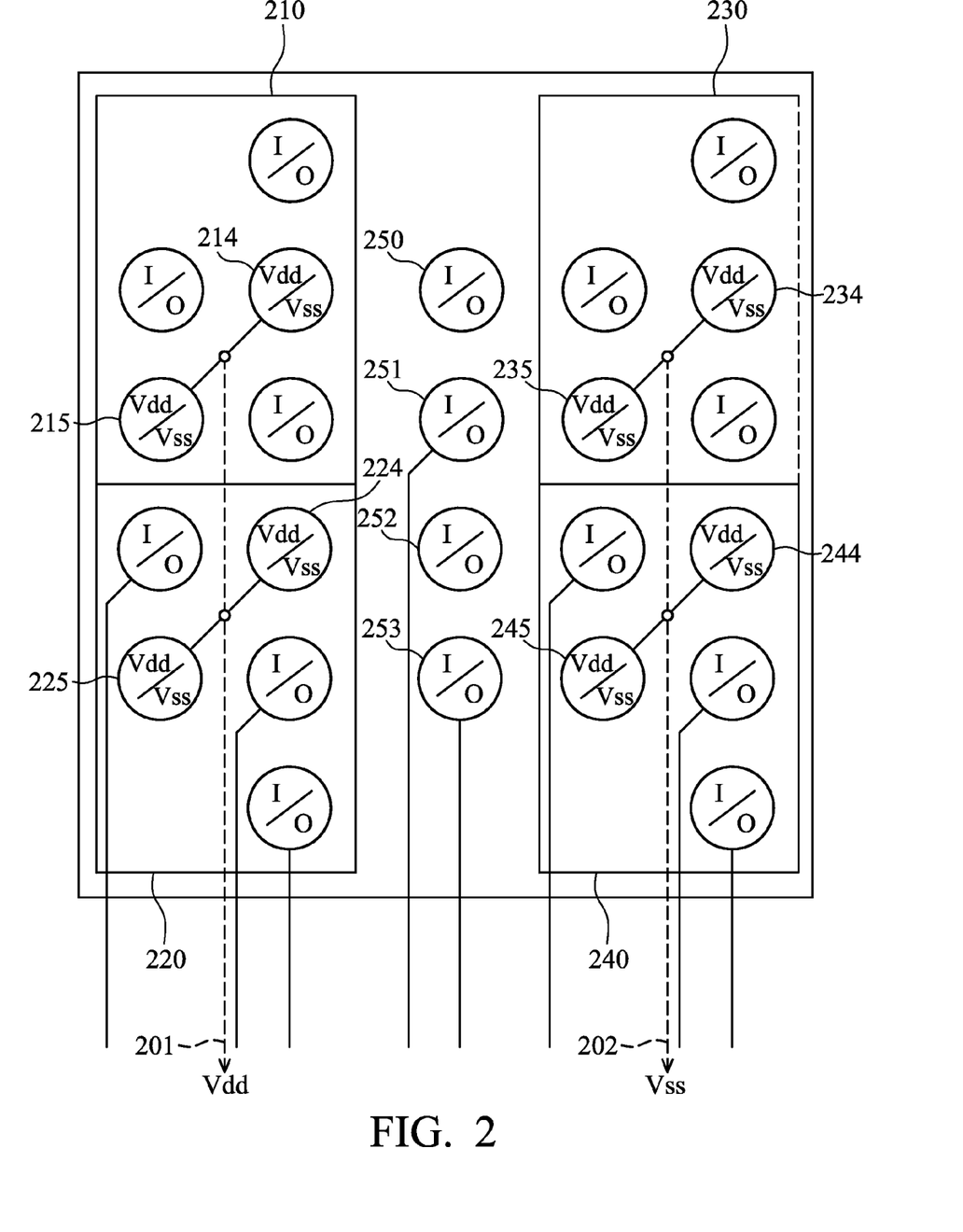
FIG. 2 is an illustration of contact point assignment based on the 3×2 grid array patterns of FIG. 1 according to another embodiment of the invention.

FIG. 2 is an illustration of contact point assignment based on the 3×2 grid array patterns of FIG. 1 according to another embodiment of the invention. The 3×2 grid array 210 is 3×2 grid array pattern 110 rotating 180 degrees, and fixed potential contact points 214 and 215 are through circuit line 201 coupled to power Vdd. The 3×2 grid array 220 is based on 3×2 grid array pattern 120, and fixed potential contact points 224 and 225 are also through circuit line 201 coupled to power Vdd. The 3×2 grid arrays 210 and 220 form a 6×2 array. Straight circuit line 201 is coupled to DC power Vdd and fixed potential contact points 214, 215, 224 and 225. Circuit line 201 passes through grid arrays 210 and 220. Circuit line 201, doted line as shown in FIG. 2, is disposed on one layer, such as a PCB bottom layer. Other solid circuit lines are disposed on another layer, such as a PCB top layer.

The 3×2 grid array 230 is 3×2 grid array pattern 110 rotating 180 degrees, and fixed potential contact points 234 and 235 are through circuit line 202 coupled to power Vss or ground. The 3×2 grid array 240 is based on 3×2 grid array pattern 120, and fixed potential contact points 244 and 245 are also through circuit line 202 coupled to power Vss or ground. The 3×2 grid arrays 230 and 240 form a 6×2 array. Straight circuit line 202 is coupled to power Vss and fixed potential contact points 234, 235, 244 and 245. Circuit line 202 pass through grid arrays 230 and 240. Circuit line 202, doted line as shown in FIG. 2, is disposed on one layer, such as a PCB bottom layer. Other solid circuit lines are disposed on another layer, such as a top PCB layer. Straight circuit lines 201 and 202 are the shortest connecting lines between fixed potential contact points and potential power, such as power Vdd and Vss or ground. And four fixed potential contact points share one circuit line for saving layout area. In addition, a plurality of signal contact points 250-253 are arranged between grid arrays 210 and 230 and between grid arrays 220 and 240.

Figure 3:
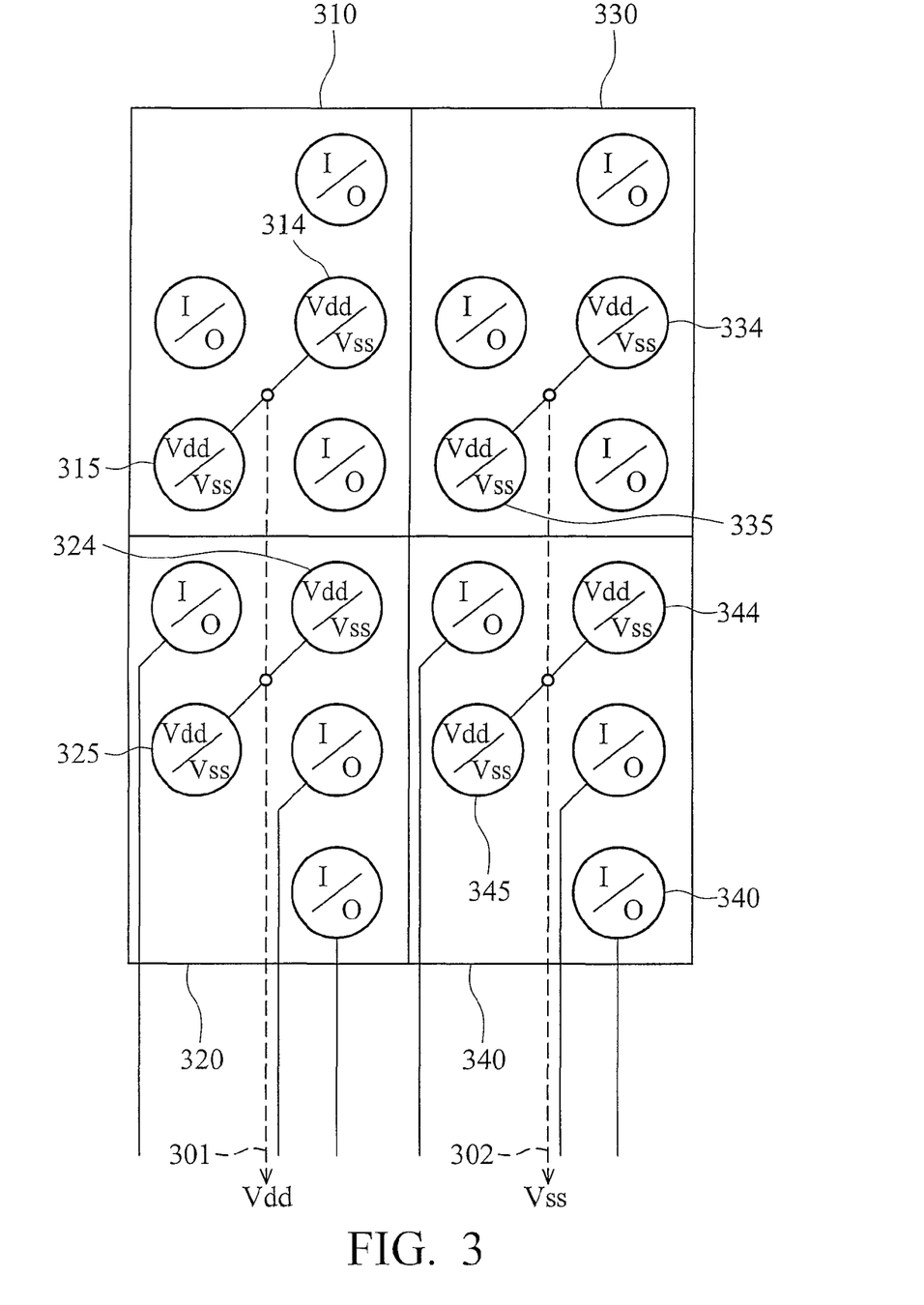
FIG. 3 is an illustration of contact point assignments based on the 3×2 grid array patterns of FIG. 1 according to another embodiment of the invention.

FIG. 3 is an illustration of contact point assignments based on the 3×2 grid array patterns of FIG. 1 according to another embodiment of the invention. The 3×2 grid array 310 is 3×2 grid array pattern 110 rotating 180 degrees, and fixed potential contact points 314 and 315 are through circuit line 301 coupled to power Vdd. The 3×2 grid array 320 is based on 3×2 grid array pattern 120, and fixed potential contact points 324 and 325 are also through circuit line 301 coupled to power Vdd. The 3×2 grid arrays 310 and 320 form a 6×2 array. Straight circuit line 301 is coupled to DC power Vdd and fixed potential contact points 314, 315, 324 and 325. Circuit line 301 passes through grid arrays 310 and 320. Straight circuit line 301, doted line as shown in FIG. 3, is disposed on one layer, such as a PCB bottom layer. Other solid circuit lines are disposed on another layer, such as a top PCB layer.

The 3×2 grid array 330 is that 3×2 grid array pattern 110 rotates 180 degrees, and fixed potential contact points 334 and 335 are through circuit line 302 coupled to power Vss or ground. The 3×2 grid array 340 is based on 3×2 grid array pattern 120, and fixed potential contact points 344 and 345 are also through circuit line 302 coupled to power Vss or ground. The 3×2 grid arrays 330 and 340 form a 6×2 array. Straight circuit line 302 is coupled to power Vss and fixed potential contact points 334, 335, 344 and 345. Circuit line 302 passes through grid arrays 330 and 340. Straight circuit line 302, doted line as shown in FIG. 3, is disposed on one layer, such as a PCB bottom layer. Other solid circuit lines are disposed on another layer, such as a PCB top layer.

Straight circuit lines 301 and 302 are the shortest connecting lines between fixed potential contact points and potential power, such as power Vdd and Vss or ground. And four fixed potential contact points share one circuit line for saving layout area. The difference between FIGS. 2 and 3 is that there are no signal contact points between grid arrays 310 and 330 and between grid arrays 320 and 340.

Referring to FIG. 2, fixed potential contact points 215 and 224 are arranged in a 2×2 array, and fixed potential contact points 235 and 244 are arranged in another 2×2 array. Referring to FIG. 3, fixed potential contact points 315 and 324 are arranged in a 2×2 array, and fixed potential contact points 335 and 344 are arranged in another 2×2 array. It is not limited that fixed potential contact points are arranged diagonally like FIGS. 2 and 3. Two of 3×2 grid array patterns 110, 120, 130 and 140 can also be used to form a 6×2 array and four fixed potential contact points can also be used to share one circuit line for saving layout area.

Figure 4:
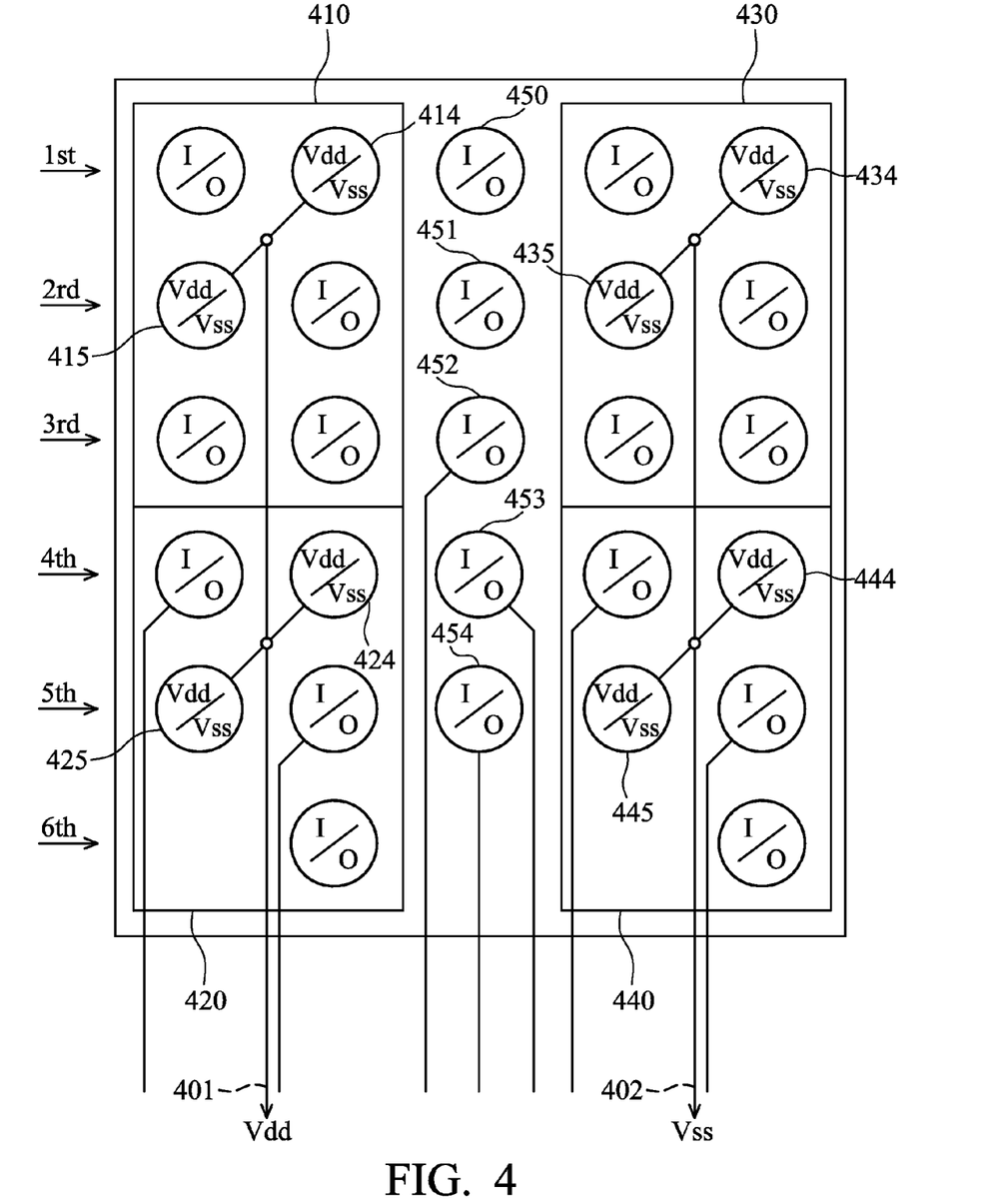
FIG. 4 is an illustration of contact point assignments based on the 3×2 grid array patterns of FIG. 1 according to another embodiment of the invention.

FIG. 4 is an illustration of contact point assignments based on the 3×2 grid array patterns of FIG. 1 according to another embodiment of the invention. The 3×2 grid array 410 is based on 3×2 grid array pattern 120 or 110, and fixed potential contact points 414 and 415 are through circuit line 401 coupled to power Vdd. The 3×2 grid array 420 is based on 3×2 grid array pattern 120, and fixed potential contact points 424 and 425 are also through circuit line 401 coupled to power Vdd. The 3×2 grid arrays 410 and 420 form a 6×2 array. Straight circuit line 401 is coupled between DC power Vdd and fixed potential contact points 414, 415, 424 and 425. Circuit line 401 passes through grid arrays 410 and 420. Circuit line 401 is disposed on one layer and other solid circuit lines are disposed on the same layer, such as a PCB top layer.

The 3×2 grid array 430 is based on 3×2 grid array pattern 120 or 110, and fixed potential contact points 434 and 435 are through circuit line 402 coupled to power VSS or ground. The 3×2 grid array 440 is based on 3×2 grid array pattern 120, and fixed potential contact points 444 and 445 are also through circuit line 402 coupled to power Vss or as shown in FIG. 4 or ground. The 3×2 grid arrays 430 and 440 form a 6×2 array. Straight circuit line 402 is coupled between power Vss and fixed potential contact points 434, 435, 444 and 445. Circuit line 402 passes through grid arrays 430 and 440. Circuit line 402 is disposed on one layer and other solid circuit lines are also disposed on the same layer. Straight circuit lines 401 and 402 can reduce the length of circuit lines between contact points and potential power, such as power Vdd or Vss. A column of signal contact points 450-454 are between grid arrays 410 and 430 and between grid arrays 420 and 440.

Figure 5:
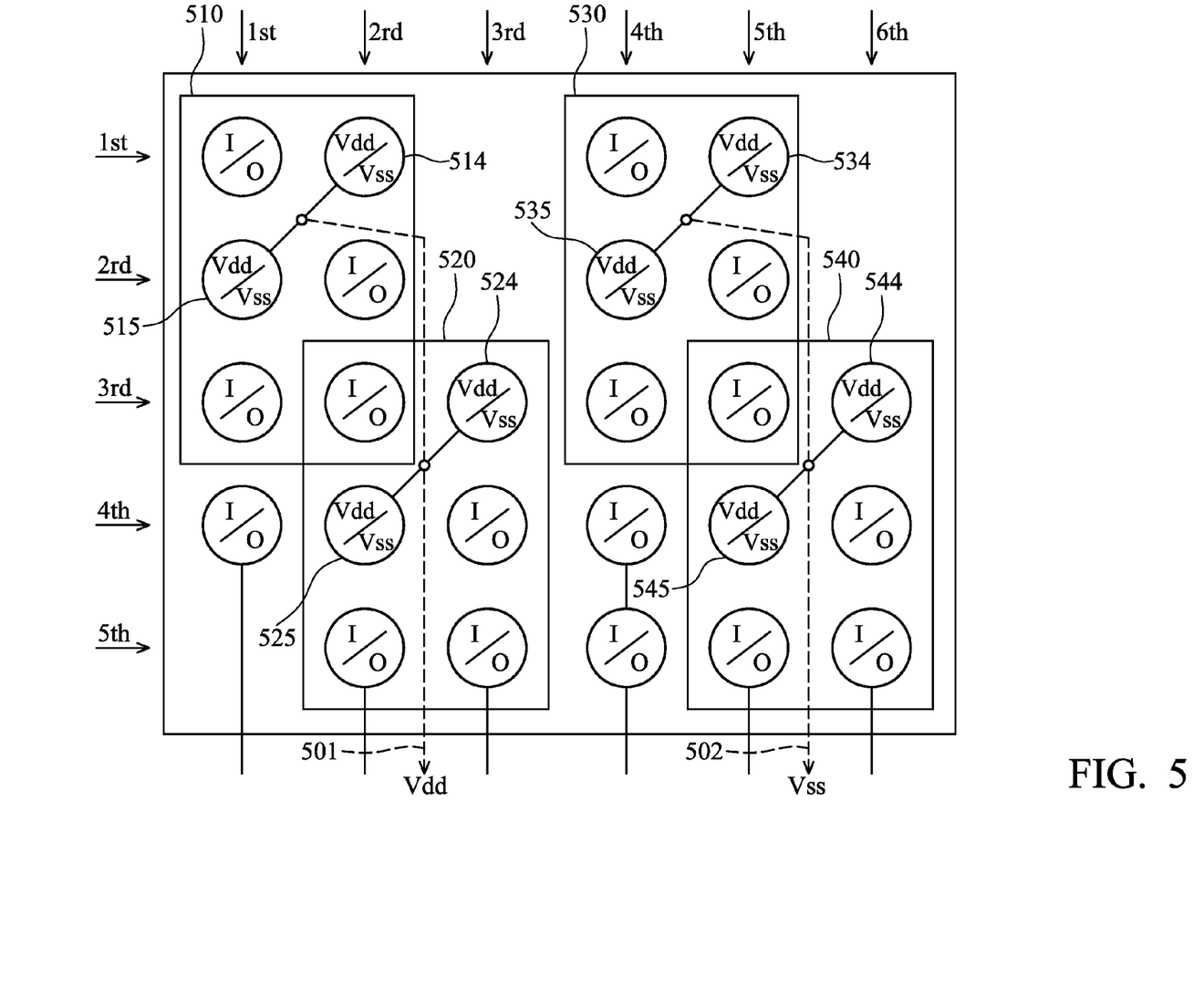
FIG. 5 is an illustration of contact point assignments based on the 3×2 grid array patterns of FIG. 1 according to another embodiment of the invention.

FIG. 5 is an illustration of contact point assignments based on the 3×2 grid array patterns of FIG. 1 according to another embodiment of the invention. The 3×2 grid array 510 is based on 3×2 grid array pattern 120 or 110, and fixed potential contact points 514 and 515 are through circuit line 501 coupled to power Vdd. Fixed potential contact points 514 and 515 are respectively arranged diagonally in the first and second rows. The 3×2 grid array 520 is based on 3×2 grid array pattern 120 or 110, and fixed potential contact points 524 and 525 are also through circuit line 501 coupled to power Vdd. Fixed potential contact points 524 and 525 are respectively arranged diagonally in the third and fourth rows. The 3×2 grid array 510 is arranged in the first and second columns, and the 3×2 grid array 520 is arranged in the second and third columns. The 3×2 grid arrays 510 and 520 share one grid. Circuit line 501 is coupled between DC power Vdd and fixed potential contact points 514, 515, 524 and 525. Circuit line 501 passes through grid arrays 510 and 520. Circuit line 501 is disposed on one layer, such as a bottom layer. Other solid circuit lines are disposed on another layer, such as a top layer.

The 3×2 grid array 530 is based on 3×2 grid array pattern 120 or 110, and fixed potential contact points 534 and 535 are through circuit line 502 coupled to power Vss or ground. Fixed potential contact points 534 and 535 are respectively arranged diagonally in the first and second rows. The 3×2 grid array 540 is based on 3×2 grid array pattern 120 or 110, and fixed potential contact points 544 and 545 are also through circuit line 502 coupled to power VSS or ground. Fixed potential contact points 544 and 545 are respectively arranged diagonally in the third and fourth rows. The 3×2 grid array 530 is arranged in the fourth and fifth columns, and the 3×2 grid array 540 is arranged in the fifth and sixth columns. The 3×2 grid arrays 530 and 540 share one grid.

Circuit line 502 is coupled between power VSS and fixed potential contact points 534, 535, 544 and 545. Circuit line 502 passes through grid arrays 530 and 540. Circuit line 502 is disposed on one layer, such as a PCB top layer. Other solid circuit lines are disposed on another layer, such as a PCB bottom layer. Circuit lines 501 and 502 can reduce the length of circuit lines between contact points and potential power, such as power Vdd or Vss.

With regard to FIGS. 2, 3, 4 and 5, it is not limited that fixed potential contact points of 3×2 grid array are respectively arranged diagonally at the bottom left corner and the top right corner of a 2×2 array. Fixed potential contact points of 3×2 grid array can be arranged diagonally at the bottom right corner and the top left corner of a 2×2 array. Circuit lines 201, 202, 301, 302, 401, 402, 501 and 502 for power Vdd and Vss or ground are wider or broader than other circuit lines for signals. Circuit lines 201, 202, 301, 302, 401, 402, 501 and 502 can have shield effect for noise interference between signal contact points.

Figure 6:
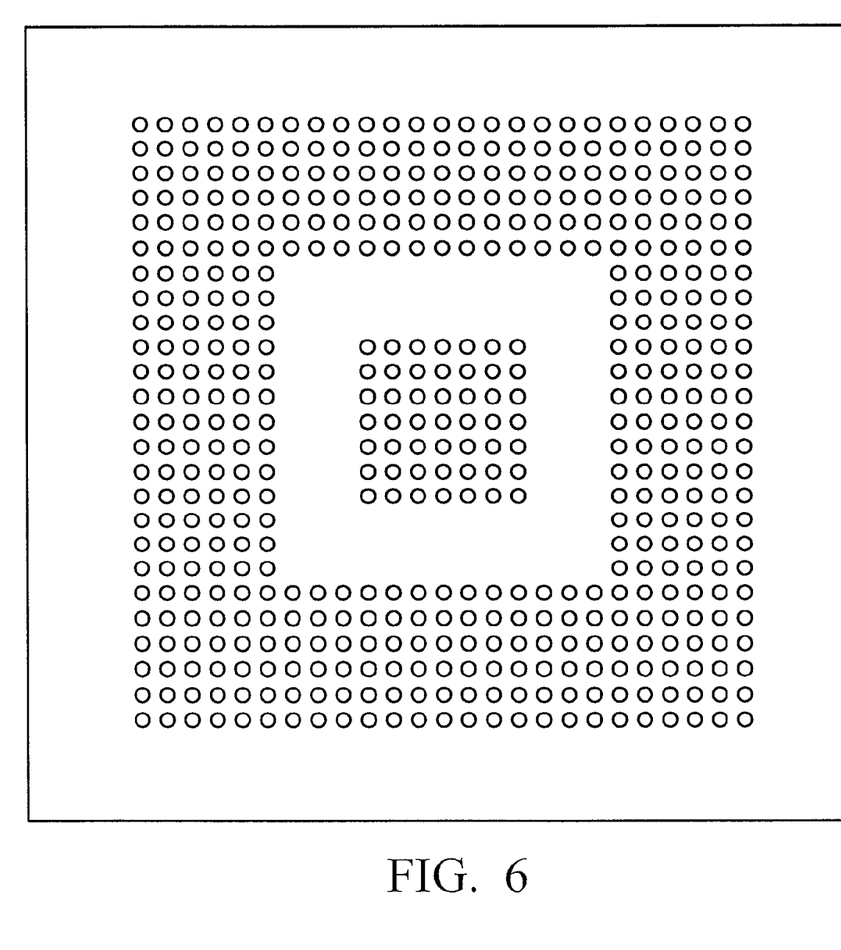
FIG. 6 is a layout of a flip chip with six layers ball according to another embodiment of the invention.

In addition, circuit lines 201, 202, 301, 302, 401 and 402 connecting to power Vdd and Vss or ground are straight lines, the shortest paths from fixed potential contact points to power or ground, for higher operational bandwidth. According to the fixed potential contact point assignment of the above embodiment, each of circuit lines 201, 202, 301, 302, 401, 402, 501 and 502 connecting to at least four fixed potential contact points can save a lot of layout area. The advantage of contact point assignments according to the above embodiments is that chips can be of high I/O density and small size, and the printed circuit board (PCB) and the ball grid array (BGA) package can have fewer layers. For example, two layered PCB or BGA package substrate with the contact point assignments according to the above embodiment can replace traditional four layered PCB or BGA package substrate for cost saving. For the same layout size, flip chips can have more signal contact points, for high I/O density. In addition, since the layout area of circuit lines for power Vdd and Vss or ground is reduced according to the above embodiments, flip chips can have more than four layered balls, such as 6 layers, as shown in FIG. 6. The contact point assignment of FIGS. 2, 3, 4 and 5 can be applied on a BGA substrate, a printed circuit board or a flip chip.

While the invention has been described by way of example and in terms of preferred embodiment, it is to be understood that the invention is not limited thereto. To the contrary, it is intended to cover various modifications and similar arrangements (as would be apparent to those skilled in the Art). Therefore, the scope of the appended claims should be accorded the broadest interpretation so as to encompass all such modifications and similar arrangements.

What is claimed is:

1. A layout circuit, comprising:
    a first 3×2 grid array, comprising:
        first, second and third signal contact points; and
        first and second fixed potential contact points coupled to a first fixed potential; and
    a second 3×2 grid array, comprising:
        fourth, fifth and sixth signal contact points; and
        third and fourth fixed potential contact points coupled to the first fixed potential;
    wherein the first and second fixed potential contact points are arranged diagonally into a first 2×2 array and the first and second signal contact points are arranged diagonally into the first 2×2 array;
    wherein the third and fourth fixed potential contact points are arranged diagonally into a second 2×2 array and the fourth and fifth signal contact points are arranged diagonally into the second 2×2 array.

2. The layout circuit as claimed in claim 1, wherein the first 3×2 grid array and the second 3×2 grid array form a first 6×2 array and a first straight circuit line coupled to the first fixed potential passes through the first and second 3×2 grid arrays.

3. The layout circuit as claimed in claim 1, wherein the first, second, third and fourth fixed potential contact points are coupled to the first fixed potential.

4. The layout circuit as claimed in claim 1, further comprising:
    a third 3×2 grid array, comprising:
        seventh, eighth and ninth signal contact points;
        fifth and sixth fixed potential contact points coupled to a second fixed potential;
    a fourth 3×2 grid array, comprising:
        tenth, eleventh and twelfth signal contact points;
        seventh and eighth fixed potential contact points coupled to the second fixed potential;
    wherein the fifth and sixth fixed potential contact points are arranged diagonally into a third 2×2 array and the seventh and eighth signal contact points are arranged diagonally into the third 2×2 array;
    wherein the seventh and eighth fixed potential contact points are arranged diagonally into a fourth 2×2 array and the tenth and eleventh signal contact points are arranged diagonally into the fourth 2×2 array.

5. The layout circuit as claimed in claim 4, wherein the third 3×2 grid array and the fourth 3×2 grid array form a second 6×2 array and a second straight circuit line coupled to the second fixed potential passes through the third and fourth 3×2 grid arrays.

6. The layout circuit as claimed in claim 4, wherein the fifth, sixth, seventh and eighth fixed potential contact points are coupled to the second fixed potential.

7. The layout circuit as claimed in claim 4, wherein the first 3×2 grid array is directly adjacent to the second 3×2 grid array and the second and third fixed potential contact points are arranged into a fifth 2×2 array, and wherein the third 3×2 grid array is directly adjacent to the fourth 3×2 grid array and the sixth and seventh fixed potential contact points are arranged into a sixth 2×2 array.

8. The layout circuit as claimed in claim 7, wherein a plurality of signal contact points are arranged between the first and third 3×2 grid arrays and between the second and fourth 3×2 grid arrays.

9. The layout circuit as claimed in claim 4, wherein the first and second 3×2 grid arrays form a third 6×2 array, the first and second fixed potential contact points are respectively arranged in first and second rows, the third signal contact point is arranged in third row and the third and fourth fixed potential contact points are respectively arranged in fourth and fifth rows.

10. The layout circuit as claimed in claim 9, wherein the third and fourth 3×2 grid arrays form a fourth 6×2 array, the fifth and sixth fixed potential contact points are respectively arranged in the first and second rows, the ninth signal contact point is arranged in the third row and the seventh and eighth fixed potential contact points are respectively arranged in the fourth and fifth rows.

11. The layout circuit as claimed in claim 10, wherein the fifth, sixth, seventh and eighth fixed potential contact points are coupled to the second fixed potential.

12. The layout circuit as claimed in claim 9, wherein the first, second, third and fourth fixed potential contact points are coupled to the first fixed potential.

13. The layout circuit as claimed in claim 4, wherein the first 3×2 grid array is arranged in first and second columns, the second 3×2 grid array is arranged in the second and third columns, the first and second 3×2 grid arrays share one grid, the first and second fixed potential contact points are respectively arranged in first and second rows and the third and fourth fixed potential contact points are respectively arranged in third and fourth rows.

14. The layout circuit as claimed in claim 13, wherein the third 3×2 grid array is arranged in fourth and fifth columns, the fourth 3×2 grid array is arranged in the fifth and sixth columns, the third and fourth 3×2 grid arrays share one grid, the fifth and sixth fixed potential contact points are respectively arranged in first and second rows and the seventh and eighth fixed potential contact points are respectively arranged in the third and fourth rows.

15. The layout circuit as claimed in claim 14, wherein the fifth, sixth, seventh and eighth fixed potential contact points are coupled to the second fixed potential.

16. The layout circuit as claimed in claim 13, wherein the first, second, third and fourth fixed potential contact points are coupled to the first fixed potential.

17. The layout circuit as claimed in claim 1, wherein the layout circuit is applied on a substrate, a printed circuit board, a ball grid array package or a flip chip.

* * * * *